(12) United States Patent
Batchelder

(10) Patent No.: US 6,175,495 B1
(45) Date of Patent: Jan. 16, 2001

(54) HEAT TRANSFER APPARATUS

(76) Inventor: John Samuel Batchelder, 2 Campbell Dr., Somers, NY (US) 10589

( * ) Notice: Under 35 U.S.C. 154(b), the term of this patent shall be extended for 0 days.

(21) Appl. No.: 09/153,523

(22) Filed: Sep. 15, 1998

(51) Int. Cl.[7] .................................................. H05K 7/20
(52) U.S. Cl. ................................ 361/695; 165/8; 165/10; 165/186; 165/122
(58) Field of Search ............................. 165/6, 8, 10, 86, 165/121–122; 174/16.3; 361/689, 695, 697–699, 704, 707, 710, 715

(56) References Cited

U.S. PATENT DOCUMENTS

| | | | |
|---|---|---|---|
| 4,880,049 | 11/1989 | Jaeger | 165/6 |
| 5,000,254 | 3/1991 | Williams | 165/85 |
| 5,004,041 | 4/1991 | Jaeger | 165/8 |
| 5,062,471 | 11/1991 | Jaeger | 165/8 |
| 5,202,803 | 4/1993 | Albrecht | 360/97.02 |
| 5,335,143 | 8/1994 | Maling | 361/694 |
| 5,431,216 | 7/1995 | Ogushi | 165/126 |
| 5,557,501 | 9/1996 | DiStefano | 361/704 |
| 5,841,633 | * 11/1998 | Huang | 361/695 |

OTHER PUBLICATIONS

A.Bar–Cohen, "Low–Cost Thermal Management of High Power Electronic Components", Semi–Therm XIV, San Diego, CA, Mar. 8–9, 1998.

Thermacore Inc. HP–1 Heat Pipe Product Data Guide, Apr. 16, 1997, 780 Eden Road, Lancaster, PA, 17601 USA.

* cited by examiner

*Primary Examiner*—Gregory Thompson

(57) ABSTRACT

An apparatus to transfer heat from a heat source to a heat sink, the apparatus consisting of a solid thermal conveyer proximate to the heat source and the heat sink. Heat from the heat source is transferred to the thermal conveyer; this heat is conveyed by the thermal conveyer, and this heat is then transferred to the heat sink. An external means moves the solid thermal conveyer with respect to the heat source and the heat sink. Heat from the heat source can be transferred to the thermal conveyer by radiation, by conduction through mechanical contact, and by conduction or convection through an intermediate thermal transfer fluid. In one embodiment the area through which heat is transferred from the solid thermal conveyer to the heat sink is substantially greater than the area through which heat is transferred from the heat source to the solid thermal conveyer. In another embodiment the thermal conveyer transports heat a distance that is large compared to the dimensions of the heat source and of the heat sink.

17 Claims, 12 Drawing Sheets

HEAT TRANSFER APPARATUS

BACKGROUND OF THE INVENTION

The microprocessor has proven to be more difficult to cool with each new generation of technology. The trend of more transistors and higher switching speeds drives the power dissipation levels for processors up, while the cost of manufacturing silicon chips and the need to maintain or decrease signal path lengths keeps the area emitting that power relatively small. One parameter which quantifies the difficulty of cooling a the back side of a processor is the required heat transfer coefficient, which is thermal power per unit area per available temperature difference. The heat transfer coefficient can be expressed as watts per (degrees Centigrade square centimeters). For example, the required heat transfer coefficient required for the back side contact to a 300 MHz Pentium II processor in 1997 is approximately 0.7 (watt/° C. $cm^2$). The Intel technology roadmap says that in the year 2006 a processor will release 200 watts of heat into a 15 millimeter square chip with a junction temperature of 50° C. above ambient, so that the required heat transfer coefficient at the chip will be 1.8 (watt/° C. $cm^2$).

Two broad classes of heat transfer devices are currently in use. One class conducts the heat from the heat source to a heat sink through a relatively stationary solid material—a passive thermal spreader. Most microprocessor coolers today use this design; an example is a spreader plate with attached fins, plus a fan to circulate air through the fins. They are typically relatively simple, compact, reliable, and inexpensive. Passive spreader devices are characterized by relatively lower heat transfer coefficients; the heat transfer coefficients achieved by these devices are typically less than 1.2 (watt/° C. $cm^2$).

Another broad class of heat transfer devices uses an intermediate fluid to transport the heat from the heat source to the heat sink—a thermal convector. An automobile engine today is typically cooled this way; heat from the block is conducted into water, which is pumped into a radiator, where the heat is then conducted into a forced air flow. They are typically relatively complex and expensive compared to the first class of heat transfer devices. These heat transfer devices are characterized by relatively higher heat transfer coefficients; the heat transfer coefficients achieved by these devices can be as high as 10 (watt/° C. $cm^2$).

The heat transfer coefficient requirements of microprocessors are crossing the gray transition between the two classes. Other devices such as some laser bar arrays and power transistors will have or already have crossed that transition. There is an economic impetus to develop a different class of heat transfer devices which have the high heat transfer coefficients characteristics of the second class while retaining as many of the positive characteristics of the first class as possible. This different class of heat transfer devices might have utility beyond cooling electronics devices, including other applications such as aerospace, manufacturing processes, chemical engineering, power generation, and material processing (such as tempering).

SUMMARY OF THE INVENTION

The primary objective of this invention is to provide an heat transfer apparatus that incorporates a solid thermal conveyer moving with respect to a heat source to provide high heat transfer coefficient cooling to a high density heat source.

A further objective of this invention is to provide a design for cooling a heat source which provides a higher heat transfer coefficient than is practical for a passive spreader design. A further objective of this invention is to provide a design for cooling a heat source which provides greater mechanical shear rates and thermal gradients at the thermal interface to the heat source than is practical for a thermal convection design.

A further objective of this invention is to provide a heat sink design for electronic components that uses a single motor to impel atmospheric motion and the motion of an internal solid thermal conveyer.

A further objective of this invention is to provide an active spreader plate without hoses or fluid couplings.

A further objective of this invention is to provide an isothermal surface while using a minimum of costly high thermal conductivity materials.

A further objective of this invention is to embody a device to transfer heat from a heat source to a heat sink in a compact, reliable, and inexpensive package.

DETAILED DESCRIPTION

Solid Thermal Conveyer Vs. Forced Convection

The rate that heat can be conducted from a source to a sink depends on the temperature difference between the heat source and sink, the geometry of the source and the sink, and the heat transfer mechanism used. If the temperature difference is large, heat transfer by radiation provides the lowest thermal resistance. For temperature differences typical of most terrestrial applications, the simplest heat transfer mechanism is conduction through stationary matter bridge between the heat source and sink. When too much heat has to be carried too far at too little a temperature difference for even the highest thermal conductivity materials like diamond to conduct the heat satisfactorily, more complex heat transfer techniques are used. Generally these more complex techniques involve transferring heat first from the heat source to a convecting or thermal transfer fluid, then moving the thermal transfer fluid, then transferring the heat from the thermal transfer fluid to the heat sink.

This invention is particularly applicable where the heat transfer coefficients from the heat source have to be high, or where the distance between the heat source and sink is relatively large, or where the temperature differences between the heat source and sink are relatively small.

Figure 1:
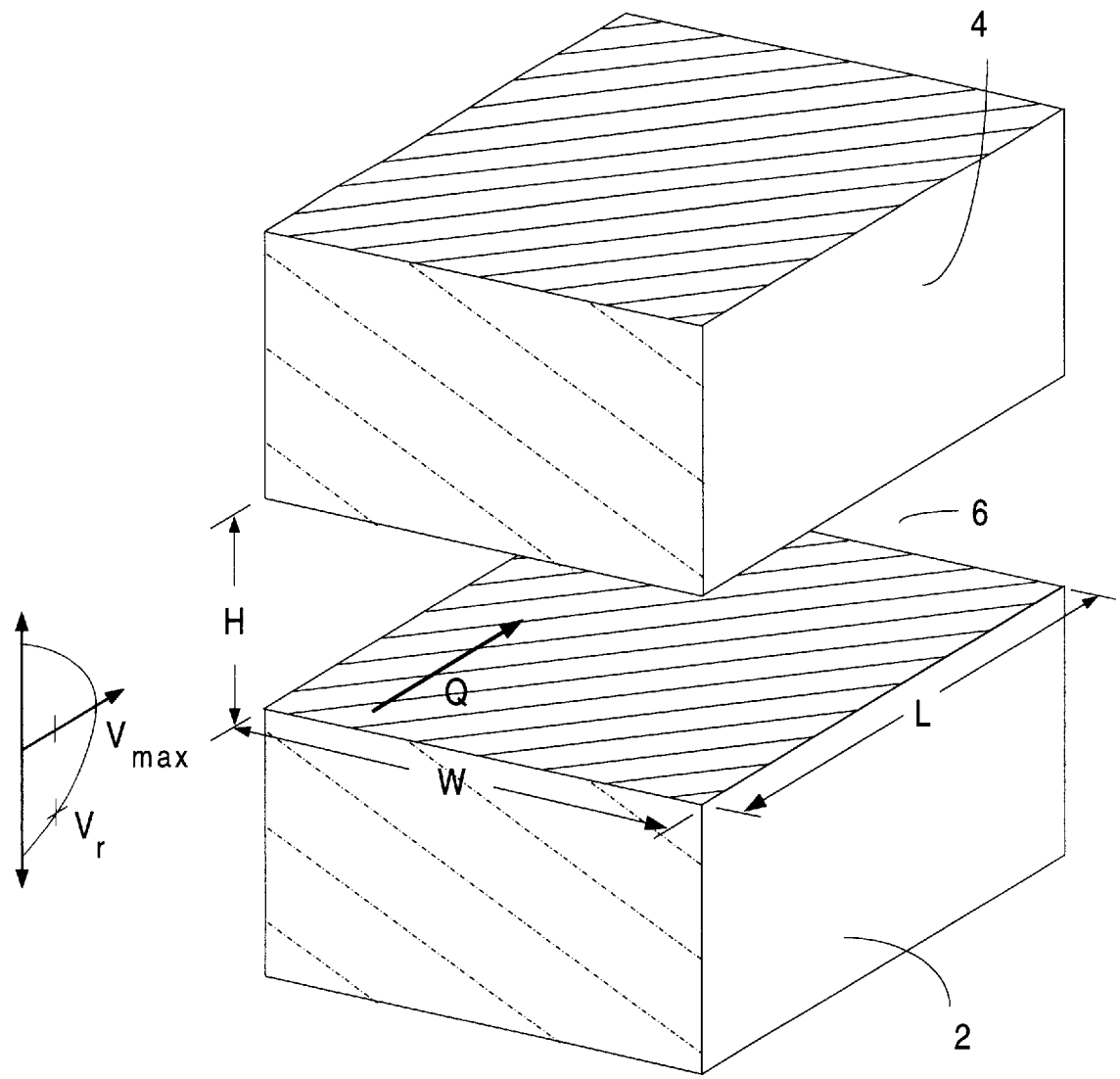
FIG. 1 shows prior art geometry for forced convection cooling of a heated surface.

In FIG. 1 a heat source (2) and a fixed wall (4) form a channel (6) through which flows a thermal transfer fluid. The case of fully developed flow is shown, where the velocity profile of the fluid is parabolic. The heat transfer rate into the thermal transfer fluid is related to the flow rate, the fluid's thermal properties, and the gap H across the channel.

Figure 2:
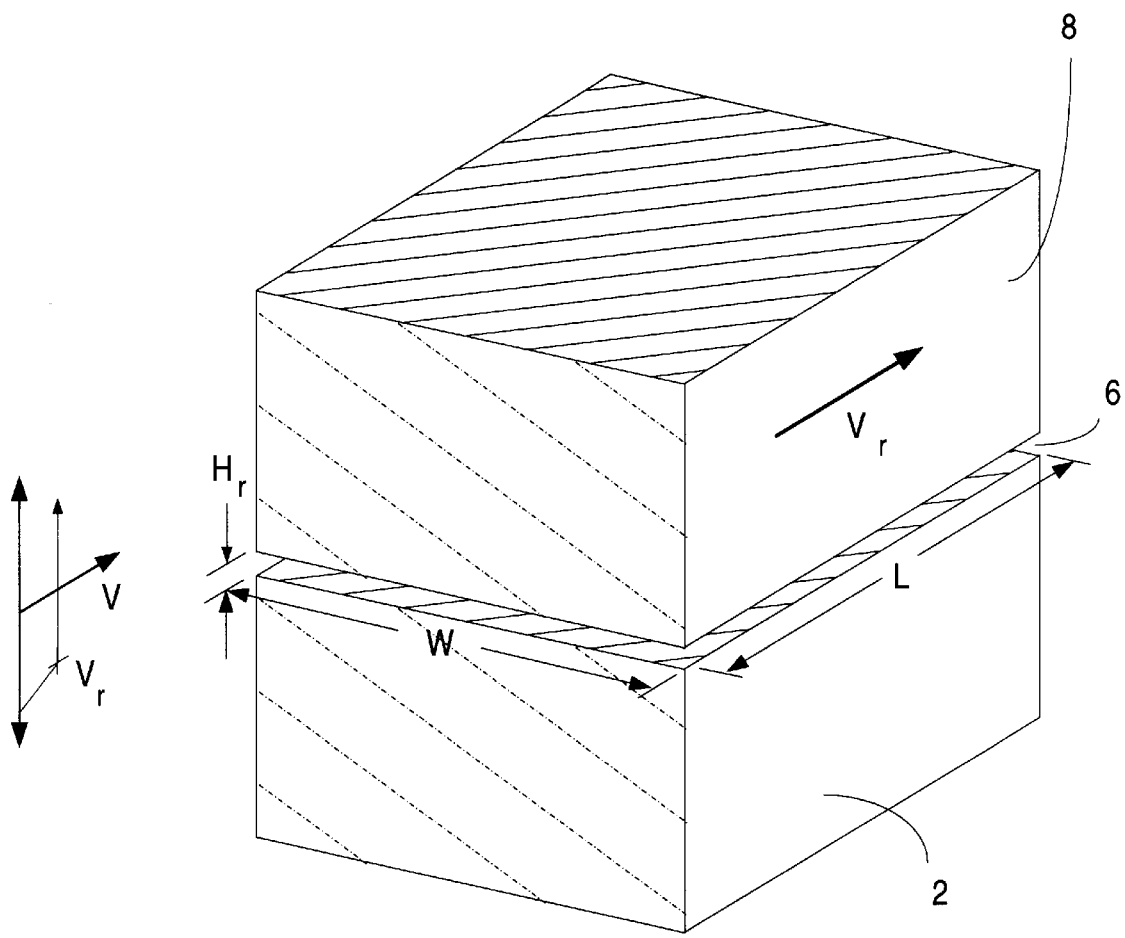
FIG. 2 shows geometry for solid thermal conveyer cooling of a heated surface.

In FIG. 2 the heat source (2) is separated from a moving wall or a solid thermal conveyer (8) by a gap $H_r$, where generally $H_r << H$. The solid thermal conveyer (8) moves with velocity $V_r$ parallel to the surface of the heat source (2). If $H_r > 0$, the gap is filled with a thermal transfer fluid. The heat transfer rate is primarily related to the thickness of the gap, since the thermal conductivity of the conveyer material can usually be chosen to be several orders of magnitude higher than that of the thermal transfer fluid. The average velocity of the thermal transfer fluid is $V_r/2$, however the heat convection associated with this flow is usually small compared to the heat transfer rate to the solid thermal conveyer (8).

Practical experience usually teaches that sliding one surface over another is a good way to generate heat, as in burning one's hands sliding down a rope. It is not so obvious that a similar mechanism is a good way to dissipate or transfer heat. However the magnetic disk industry has demonstrated that surfaces can be slid very close to each other for a modest cost, for long periods of time, and without significant wear. Therefore it should follow that a similar geometry should allow high rate heat transfer between two surfaces.

Power from an external means is required to pump the thermal transfer fluid through the convector shown in FIG. 1. Power from an external means is required to translate the conveyer (8) shown in FIG. 2. If viscosity of the thermal transfer fluid and the rate of shear of the fluid at the heated surface (2) is the same in both cases, then the power required to impel the conveyer will be less than the power required to pump the thermal transfer fluid, since there will be additional viscous dissipation in the remaining volume of the channel in the convector case.

Linear Conveyer

Figure 3:
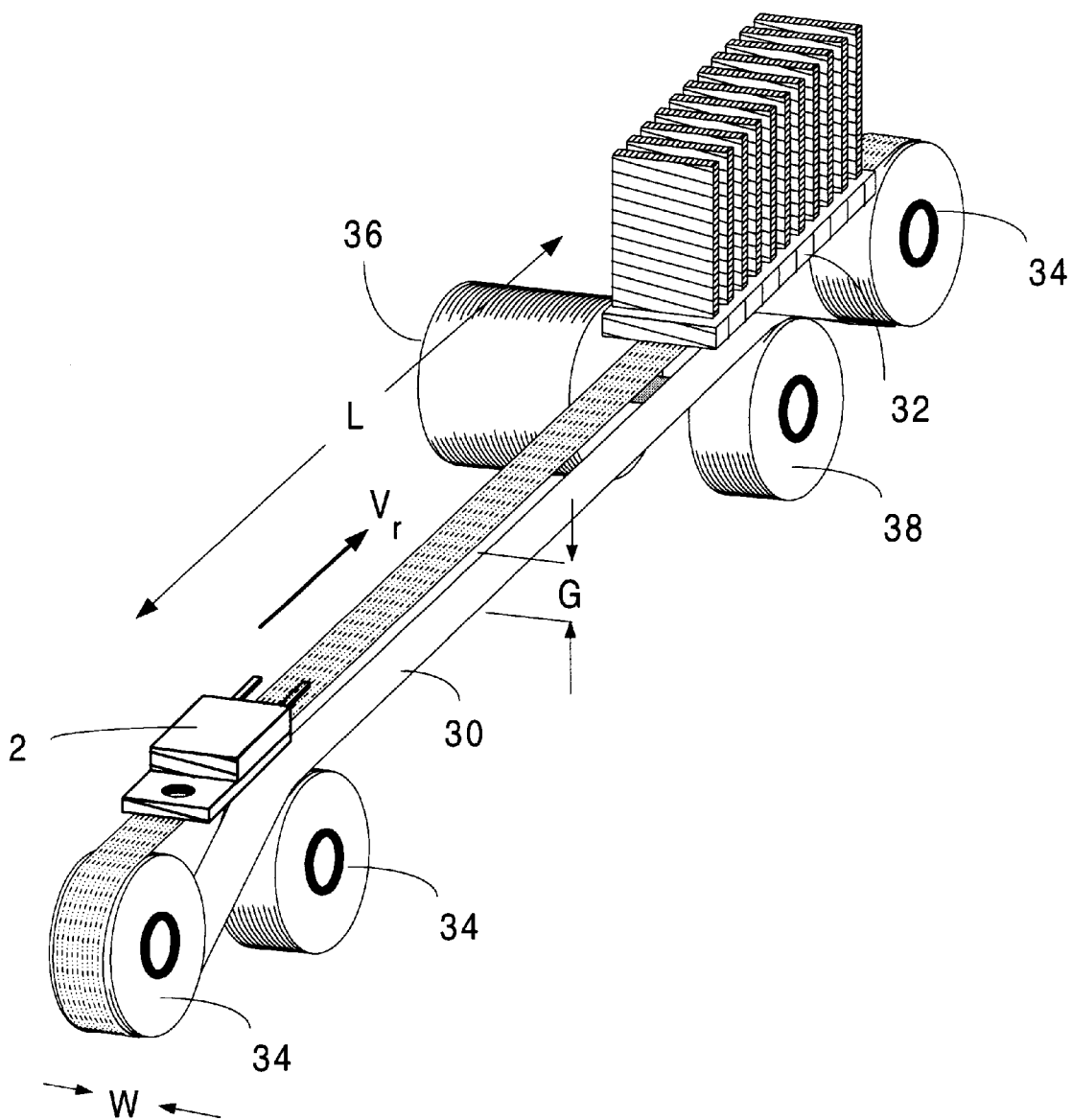
FIG. 3 shows a linear solid thermal conveyer performing a function analogous to a heat pipe.

In the next example we look at exchanging heat over a relatively long distance, so that we can compare this invention to a commercial heat pipe. A quarter inch diameter HP-1 heat pipe from Thermacore, Inc., will carry 25 watts of power 18 inches with a 13° C. temperature drop. In contrast, FIG. 3 shows an implementation of this invention in which a metallic ribbon (30) of width W and thickness T conveys heat from a heat source (2) to a heat sink (32). Idler rollers (34) guide the conveyer (30) passed the heat source with velocity $V_r$. A motor (36) drives the belt through a capstan (38). We set the gap G between the counter-propagating portions of the conveyer (30) to be 0.2 inches, and the width of the conveyer (30) W to be 0.2 inches, so that the combined cross sectional area of the conveying portion of FIG. 3 is somewhat less than the cross sectional area of the previously described heat pipe. Assuming that the rollers (34) are an inch in diameter, the thickness of the conveyer (30) should be no greater than about 3 mils (0.003 inches) so that flexing of the metal does not generate fatigue failure. Assuming conservatively that there is a 3° C. temperature difference between the heat source (2) and the conveyer leaving the heat source, as well as a 3° C. difference between the conveyer leaving the heat sink and heat sink (32), the thermal power carrying capacity of the conveyer is the product of the 7° C. difference between the counter-propagating portions of the conveyer (30) times the heat capacity of the metal in the conveyer times the conveyer velocity $V_r$; for example a nichrome belt at $V_r$=120 inches per second conveys 30 watts. The heat capacity can be increased by using a thicker segmented belt and by increasing the velocity of the conveyer. To determine the maximum length L for conveying heat, we require that a Teflon insulator in the gap between the counter-propagating portions of the conveyer (30) conduct no more than 5 watts. We find that the conveyer of FIG. 3 should carry the same power over a distance of 112 inches through the same cross sectional area with the same temperature difference as the 18 inch commercial heat pipe. The length can be extended by using more thermally insulating spacer material such as expanded foam.

The heat pipe has advantages over the conveyer design of FIG. 3; it requires no external power, and it has no wearing parts. The conveyer design of FIG. 3 has an advantage over heat pipes of having lower weight per unit length. The conveyer of FIG. 3 does not experience power saturation, which occurs in heat pipes when the gas velocity gets near the speed of sound (for example, power saturation occurs in the Thermacore HP-1 at 25 watts).

The conveyer design of FIG. 3 has utility for a variety of primarily one dimensional heat transport applications. The design can be used to extract heat from an airplane's propulsion engine for de-icing wings. It can be miniaturized in a catheter to locally apply or remove heat in animals.

The functioning of the thermal conveyer of FIG. 3 is analogous to molten plastic or metal being extruded by a heated die. The extrudate conveys heat away from the heated extruder, transferring it to the air or some other heat sink. The primary difference is that in a molten plastic or metal extruder, at least for a portion of the process, the extrudate is not a solid.

The functioning of the thermal conveyer of FIG. 3 is analogous to the melt-spinning method of producing metallic glasses. In melt-spinning a heat source consisting of molten metal is applied as a thin ribbon to a chilled rotating copper wheel; the high thermal gradients between the melt and the wheel chill the melt so quickly that crystallites don't form, and the melt stays glassy. Melt-spinning is different from a solid thermal conveyer in that the heat source (the melt) and the wheel do not move with respect to each other during the heat transfer process.

Two and Three Dimensional Conveyer

Figure 4:
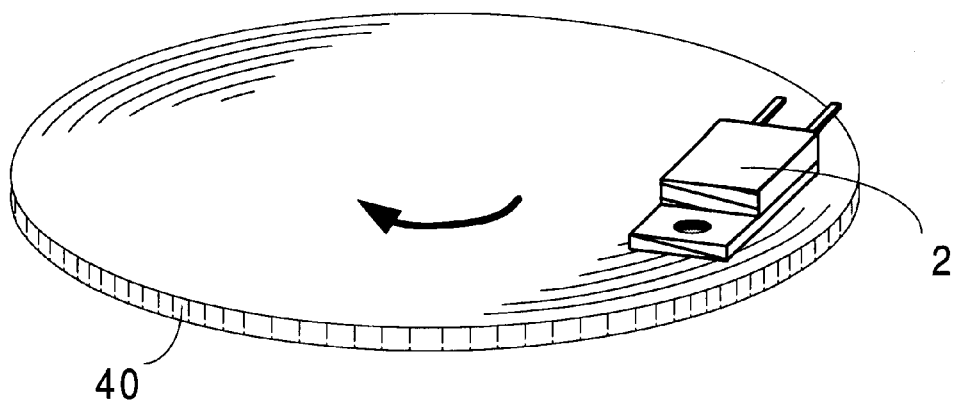
FIG. 4 shows a rotary solid thermal conveyer.

FIG. 4 shows the simplest configuration of the invention. A heat source (2) is placed in thermal contact with a moving solid thermal conveyer (40), which in this case is a flat disk. The disk is rotated by an external means. In FIG. 4 the disk is immersed in air, so that the rotation of the disk forms a Von Karman pump which circulates air passed the disk; the surrounding air forms the heat sink. The leading edge of the heat source (2) that contacts the solid thermal conveyer (40) is formed as a step bearing so that a thin film of air is trapped between the heat source (2) and the solid thermal conveyer (40). The heat source (2) must move with respect to the solid thermal conveyer (40); in the most preferred embodiment the heat source is stationary. Heat can be transported from the heat source (2) to the solid thermal conveyer (40) by direct mechanical contact, by radiation, or by conduction through an intermediate thermal fluid. If the heat source (2)

and the solid thermal conveyer (40) are mechanically contacted, appropriate surface treatments are required on one or both surfaces to prevent abrasion, galling, and wear. Wear resistant surfaces include plated, plasma sprayed, and ion implanted hard coatings, including diamond-like carbon. Solid lubricant coatings can be used like graphite, molybdenum compounds, and Teflon.

An intermediate thermal transfer fluid can also be used. The most preferred embodiment uses a thermal transfer fluid composed of a perfluorinated hydrocarbon lubricant, such as is commonly used to coat the disks in magnetic disk drives. In a preferred embodiment the thermal transfer fluid is a lubricating oil. In less preferred embodiments the fluid can include air, argon, bismuth, Fluorinert, gallium, grease, helium, mercury, mineral oil, nitrogen, potassium, silicon oil, sodium, tin, water soluble grease, and xenon. A thixotropic thermal transfer fluid is desirable to minimize the viscous drag between the solid thermal conveyer and the heat source, while minimizing the tendency of the fluid to be thrown off of the conveyer. A high thermal conductivity thermal transfer fluid is preferable. The intermediate thermal transfer fluid should have properties of a lubricant.

The lubricant layer between the heat source and the solid thermal conveyer can include mixtures of solid, liquid, and gaseous components.

To maintain a small gap between the heat source and the solid thermal conveyer, two types of forces must be in balance. The first force urges the surfaces of the heat source and the solid thermal conveyer together; mechanisms to generate this first force will be subsequently described. The second force urges the surfaces of the heat source and the solid thermal conveyer apart. The second force is usually achieved using a thermal transfer fluid to generate a step or wedge fluid bearing, such as is used in the sliders of magnetic disk heads. The second force can also be generated by the Bernoulli effect, a Von Karman pump, impingement flow, a step bearing, and a viscosity pump. The second force can also be generated by mechanical contact between the surface of the heat source and the surface of the solid thermal conveyer.

The functioning of the thermal conveyer in FIG. 4 is analogous to a disk brake assembly, the heat source (2) is in contact with the solid thermal conveyer (40) in a manner similar to a brake pad contacting a rotor. The primary difference is that the source of heat in a disk brake assembly is the interface between the brake pad and the rotor, and is not the brake pad itself. One manifestation of this difference is that the temperature of the brake pad in an operating disk brake assembly will be lower than the temperature of the interface between the rotor and the brake pad, while the temperature of the heat source (2) will be higher than the temperature of the interface between the heat source (2) and the solid thermal conveyer (40).

Figure 5:
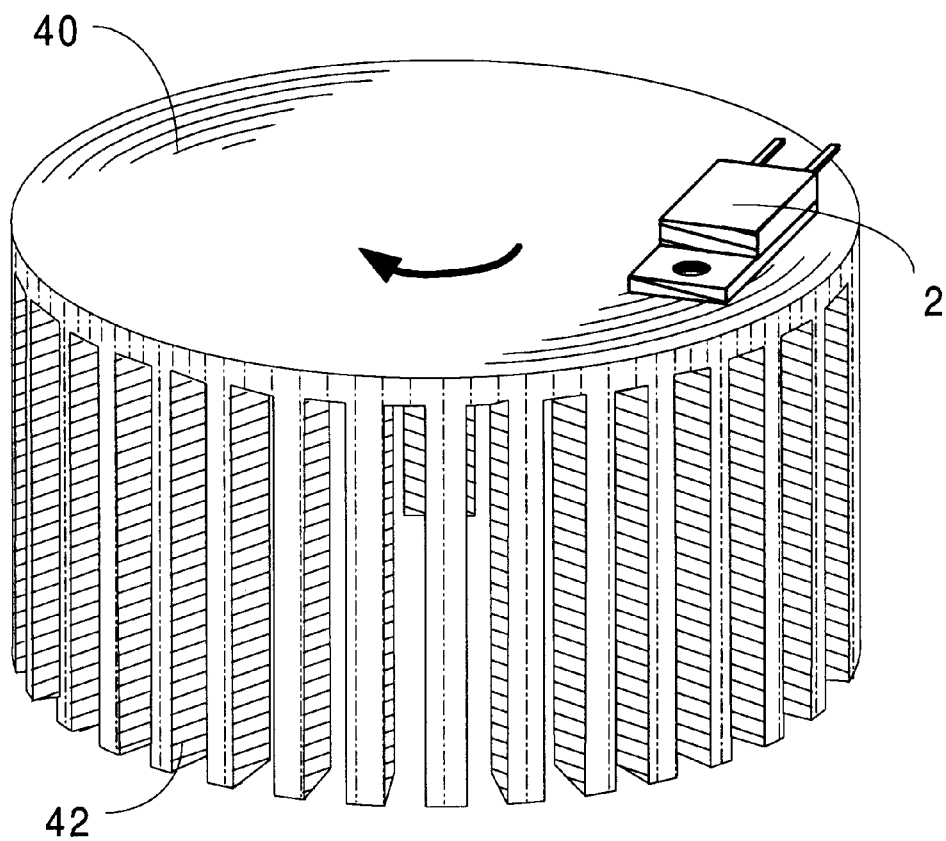
FIG. 5 shows a rotary solid thermal conveyer with an attached fin means.

In FIG. 5 vanes (42) have been added to the solid thermal conveyer (40). The vanes (42) form a heat sink in intimate contact with the solid thermal conveyer (40), and they also serve to centripetally motivate air to flow through the gaps between the vanes, so that the air carries away the heat. Other impeller geometries can be attached to the solid thermal conveyer (40), such as blades for a tubaxial fan or disks for a laminar flow fan.

Figure 6:
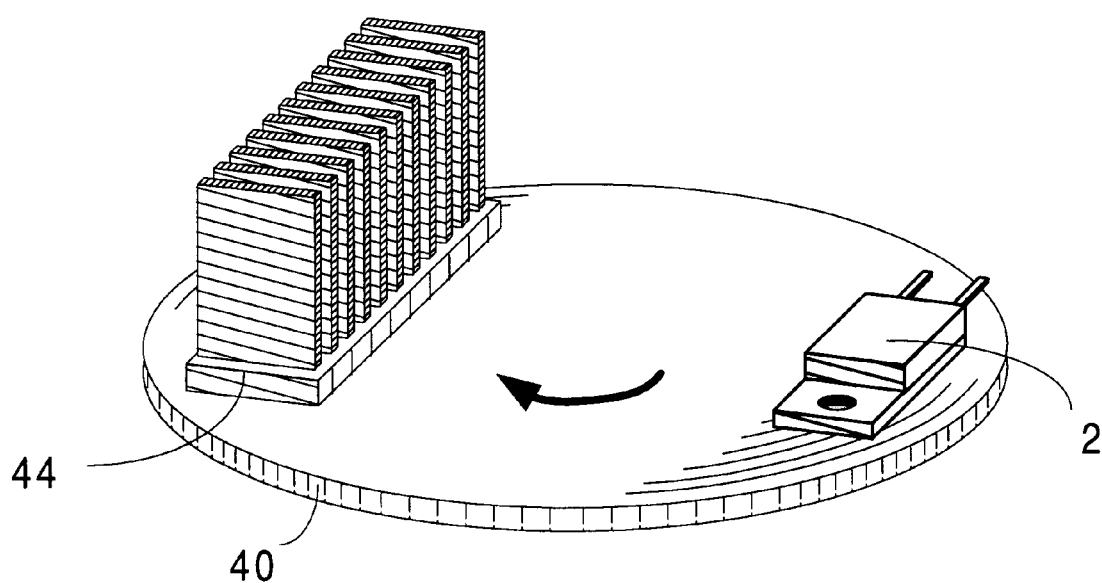
FIG. 6 shows a rotary solid thermal conveyer with the conveyer moving with respect to both the heat source and the heat sink.

In FIG. 6 the solid thermal conveyer (40) moves in close proximity to a fin means (44). Heat transfers from the solid thermal conveyer (40) to the fin means (44) through at least one of the mechanisms described for transferring heat from the heat source (2) to the solid thermal conveyer (40); in FIG. 6 a thin air gap separates the fin means (44) from the solid thermal conveyer (40). A fin means (44) is characterized by a thermal conduction means such as pins, folded fins, wires, bonded fins, pin fins, and louvers. Other fin means include stampings, castings, plates, or sheets. The thermal conduction means are arrayed so as to be permeable to a flowing heat transfer fluid such as the atmosphere, while also thermally contacting one or more surfaces. Fin means (44) can be manufactured by forging, folding, gluing, welding, brazing, casting, molding, coining, or other processes. Fin means (44) are preferably composed of aluminum, and can also be formed using metals such as copper, aluminum, iron, zinc, nickel, and silver, as well as composite materials including graphite filled plastics. The surfaces of the thermal conduction means can be grooved, textured, dimpled, embossed, or drilled to increase their surface area in contact with the heat transfer fluid.

The heat sink used in this apparatus will typically facilitate transfer of heat to a surrounding fluid. In FIG. 4 the heat sink is the surrounding fluid itself. For clarity, in the remainder of the specification we will refer to the surrounding fluid as air, however it can also be water, Freon, glycol, steam, or any other thermal transfer fluid. The heat sink will typically therefore be a fin means to provide good thermal contact to the surrounding fluid, such as is shown in FIG. 6. In a less preferred embodiment the heat sink can contain a material undergoing a phase transition, so that the heat sink can absorb heat without again transferring the heat.

Figure 7:
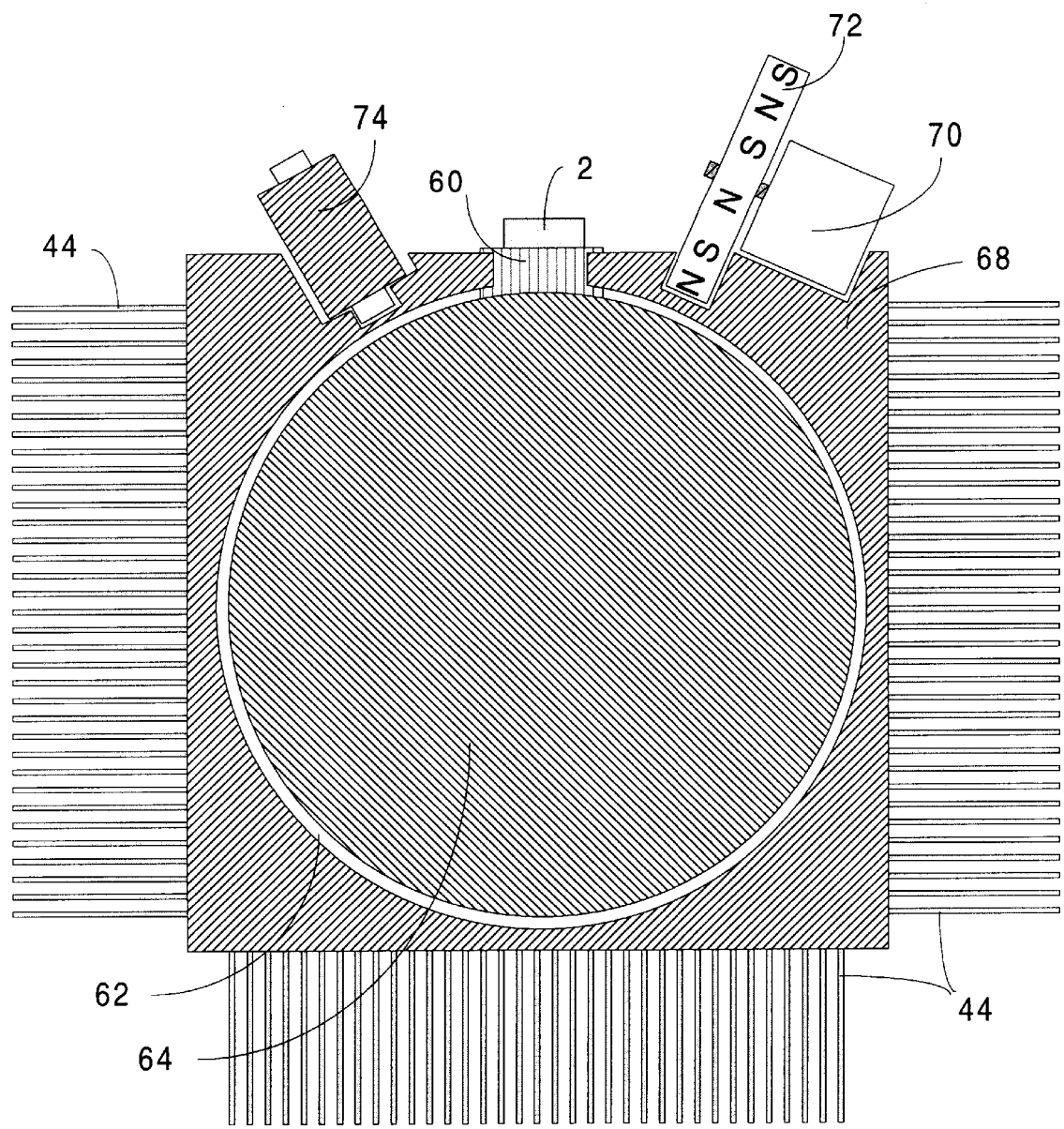
FIG. 7 shows a spherical solid thermal conveyer.

FIG. 7 shows an alternative preferred embodiment in which the solid thermal conveyer is spherical (64). A heat source (2) contacts a thermally conductive brush (60) which is in turn in sliding contact with a thermally conductive sphere (64). The sphere (64) resides in a cavity (62) containing a thermal transport fluid such as oil. The cavity (62) is formed in a thermally conductive container (68). Most of the exterior of the container (68) is faced with fin means (44). The sphere rotates by the action of an eddy current drive comprised of a disk (72) permanent magnet with multiple pole faces around its perimeter and a drive motor (70). An electromagnet (74) is occasionally energized to provide enough torque on the sphere to alter the axis of rotation and cause the majority of the surface of the sphere to pass in thermal contact with the thermally conductive brush (60).

The solid thermal conveyer belt (30) in FIG. 3 can be thought of as spreading a point heat source into a line heat source, or a zero dimensional heat source into a one dimensional heat source. The solid thermal conveyer disk (40) in FIG. 4 can be thought of as spreading a point heat source into a disk heat source, or a zero dimensional heat source into a two dimensional heat source. The solid thermal conveyer sphere (64) in FIG. 7 can be thought of as spreading a point heat source into a spherical heat source, or a zero dimensional heat source into a three dimensional heat source. Other variations on the geometry of a solid thermal conveyer are appropriate for specific applications. Alternatives to the conveyer belt (30) are a cable, a filament, a loop, a ribbon, and a Mobius strip. Alternatives to the solid thermal conveyer disk (40) are a cone, a drum, a plate, a screen, and a sheet. An ellipsoid is a generalization of a solid thermal conveyer sphere (64).

Generally there is more than one way for heat to flow from a heat source to a heat sink. For example, in FIGS. 4 and 5 air can convect heat directly off of the heat source (2). In FIGS. 4 and 5 heat is also transferred to the surrounding as air momentarily trapped between the heat source (2) and the solid thermal conveyer (40) is released back into the ambient. Other alternative means by which heat can be transferred from the heat source to the heat sink include direct and indirect radiation, solid thermal conduction through a support structure, forced convection of a thermal transport fluid, and phase transitions of thermal transport fluid. These alternative means can be present in all embodiments of this invention, however the primary heat flow path for all embodiments of this invention is from the heat source to the solid moving conveyer, and from the solid moving conveyer into the heat sink.

A solid thermal conveyer can be made from relatively poor thermal conductors, such as glass, Teflon, Kapton, Nylon, and epoxy composites. In particular, these materials are practical for applications such as the heat pipe replacement shown in FIG. 3 in which there is little or no thermal conduction required within the solid thermal conductor during the heat conveyance process. These materials can provide advantages for surface finish, durability, flexibility, and low weight. In a preferred embodiment the solid thermal conveyer is made from a relatively good thermal conductor, including metallic alloys, ceramics, crystals, and composites. Most solid thermal conveyer applications require that heat is conducted for some distance within the conveyer; In the most preferred embodiment the solid thermal conductor is an aluminum alloy, both because of its good thermal properties, and because of the cost and mechanical properties that have made it the substrate of choice for magnetic disk substrates.

Active Thermal Spreader

A thermal spreader plate, or spreader plate, is a device designed to conduct heat from a heat source with a relatively small heat emitting area to a heat absorber with a relatively larger heat absorbing area. An active spreader plate is a spreader plate that consumes power from an external source to generate physical motion of components within the spreader.

A simplified limiting case helps to identify applications that need an active spreader plate instead of a passive spreader plate. Suppose that a heat source with an area $A_s$ needs to be attached to a heat sink with a thermal resistance $R_\theta$. We idealize the problem by allowing the heat source to be a hemisphere, and by allowing the spreader plate to be a large hemispherical shell. This idealized three dimensional radial heat flow minimizes the temperature drop within the spreader plate. If we say that the spreader plate can contribute at most a thermal resistance of $R_\theta/2$, we can solve for the minimum allowable thermal conductivity of the spreader plate material:

$$k_{spreader} = \frac{2}{R_\theta \sqrt{A_s}}$$

For example, the Intel road map for microprocessor cooling for the year 2006 calls for 200 watts to be dissipated at a junction temperature of 95° C. into ambient atmosphere at 45° C. from a 15 mm×15 mm chip. From these specifications we have that $R_\theta=0.25°$ C./watt and that $A_s=2.25$ square centimeters. The minimum spreader plate thermal conductivity is then calculated by the above equation to be 533 watts/(° C. meter). Since pure aluminum has a thermal conductivity of 202 watts/(° C. meter), pure copper has a thermal conductivity of 385 watts/(° C. meter), and even silver (the metal with the highest thermal conductivity) is 410 watts/(° C. meter), no metals are available as passive thermal spreaders for this application, even under ideal conditions. For more realistic geometries, the minimum spreader plate thermal conductivity calculated is even higher.

Figure 8:
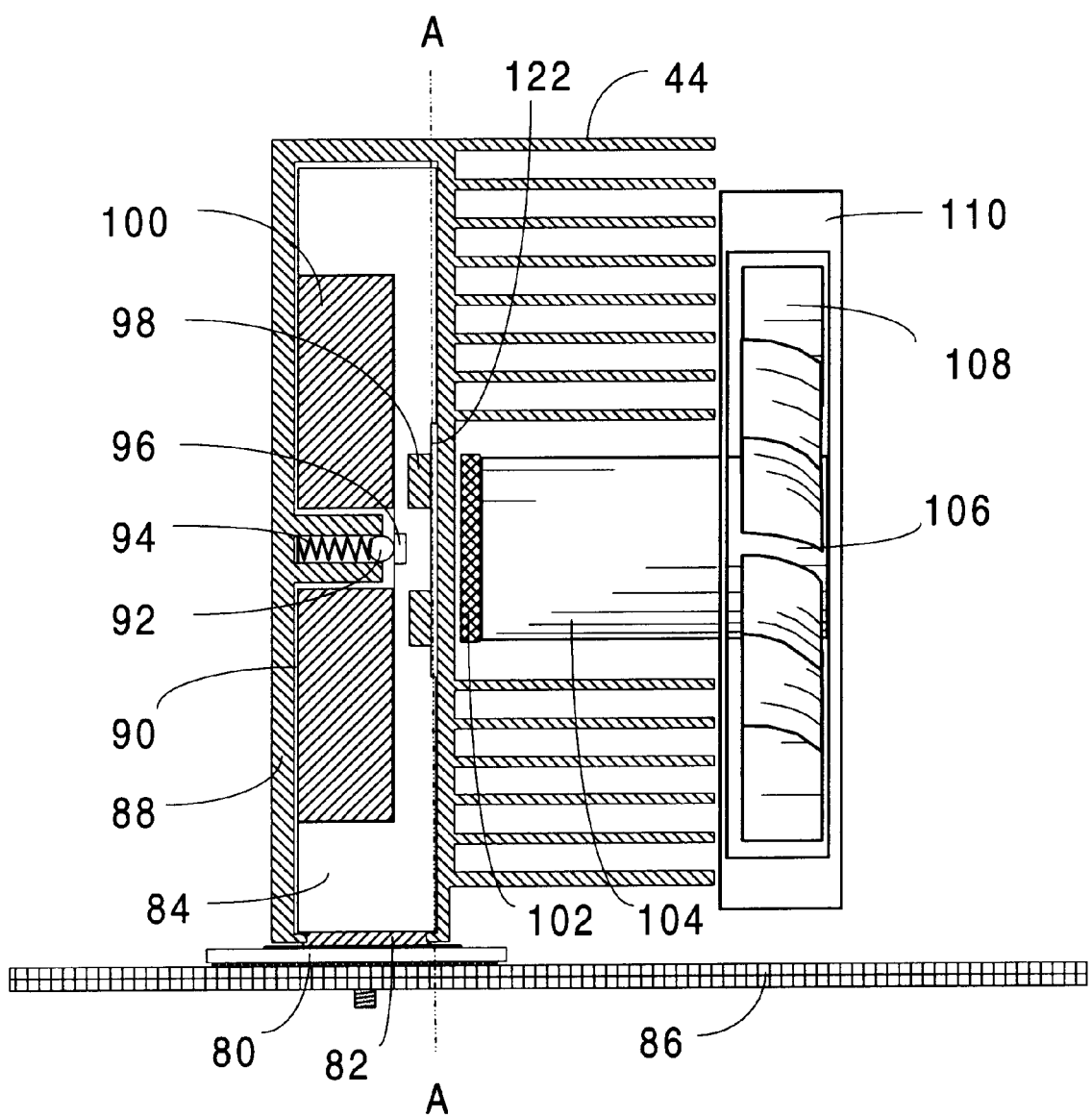
FIG. 8 is a sectional view of the most preferred embodiment of a rotary solid thermal conveyer taken along lines B—B of FIG. 9.
Figure 9:
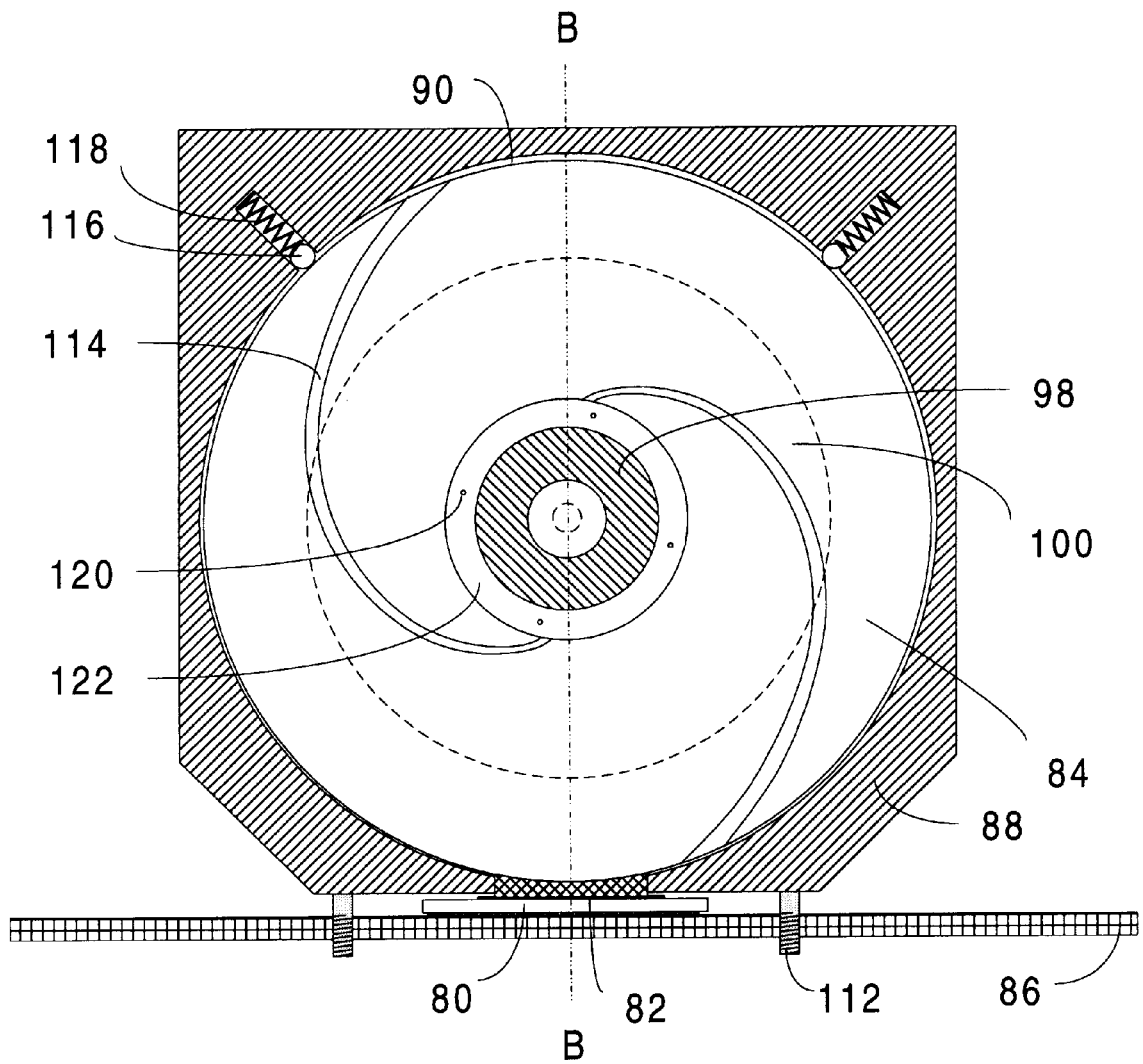
FIG. 9 is a sectional view of the embodiment taken along lines A—A of FIG. 8.

FIGS. 8 and 9 show different cross sections of the same most preferred embodiment of the invention. The cross section A—A in FIG. 8 corresponds to FIG. 9, and the cross section B—B in FIG. 9 corresponds to FIG. 8. The heat source is a packaged semiconductor electronic device (80) with electrical contacts to a second level package or circuit board (86). Heat from the heat source (80) passes through a compliant or adhesive layer to a thermal brush (82) composed of a thermally conducting material like copper or silver. The thermal brush (82) and a spinning solid thermal conveyer rotor (84) approximately 3 inches in diameter are separated by a film of thermal transport fluid. In the most preferred embodiment the thermal transport fluid is perfluorinated hydrocarbon with a viscosity of about a centipoise and a film thickness of about 50 microinches. The rotor (84) and thermal transport fluid is contained in a cavity (90) in a housing (88). The housing (88) is attached to the circuit board (86) with threaded or snap studs (112) or similar fastener. Two springs (118) press two dowel pins (116) onto the perimeter of the rotor (84), seating the rotor (84) against the thermal brush (82). Another spring (94) presses a ball bearing (92) against a hardened steel insert (96) in the rotor (84), seating the flat face of the rotor against an inside face of the housing (88); fin means (44) are attached to the corresponding outside face of the housing (88). A tubaxial fan (110) with a motor (106) and blades (108) impel air through the fin means (44), sinking heat from the fin means into ambient air. An extension (104) to the fan (110) carries a multi-pole permanent magnet (102). A copper washer (98) is embedded in the rotor (84). As the multi-pole magnet (102) rotates, moving magnetic fields pass through the housing (88) and generate eddy currents in the copper washer (98), inducing a torque on the rotor (84) and a thrust urging the rotor (84) away from the multi-pole magnet (102). The torque and thrust are greatest when the rotor (84) is stalled. In normal operation the fan (110) rotates at 3,000 rpm and the rotor (84) rotates at 100 rpm. A central portion (122) of the flat face of the rotor (84) is removed to reduce drag on the rotor where little thermal transfer is occurring between the rotor (84) and the housing (88). The spacing between the flat face of the rotor and the housing in operation is about 100 microinches. Grooves (114) in the flat face of the rotor (84) act as viscosity pumps, impelling oil from the periphery of the rotor (84) towards the center of the rotor (84); this pumping action forms the oil film on which the face of the rotor rotates, and it impels oil through feed holes (120) into a felt washer (100) mounted in the rotor (84). The felt washer (120) acts as a reservoir and a filter for the oil, metering out oil due to centripetal forces when the rotor (84) is spinning.

Alternative preferred embodiments use centrifugal or displacement pumping to circulate the thermal transfer fluid instead of the viscosity pump.

The most preferred embodiment has the advantage that it occupies relatively little footprint on the printed circuit board (86); the rotor acts as an active thermal spreader, carrying heat away from the heat source and the circuit board and distributing the heat to the fin means. This embodiment uses an external means to move the solid thermal conveyer with respect to the heat source; the external means is the motor (106) of a fan that is required in any case to transfer heat from the fins to the ambient air. The thermal brush and the flat face of the rotor are orthogonal wearing surfaces, so that they can wear down independently over time, with the felt washer removing the wear particles from the recirculating oil.

In the most preferred embodiment the periphery of the rotor (84) and the mating surface on the thermal brush (82)

are smooth cylindrical surfaces. In an alternative preferred embodiment at least one of those surfaces is grooved to produce a step bearing or a viscosity pump to improve the properties of the thermal bearing. Bosses and lands can be added to reduce stiction during start-up. Corrugations and pits can be added to improve the oil retention of the surfaces. The separation distance between the surfaces can be increased if the interface area of the surfaces in increased by forming the two surfaces as intermeshing fins or dendrites. Orifices in the periphery of the rotor can source oil into the interface by centripetal pressure.

The felt washer (120) can be replaced by a sintered metal washer. In a less preferred embodiment the functions of filtration, forming a reservoir, and metering out a flow of thermal transport fluid that increases with the rotation rate of the rotor can be fulfilled by several juxtaposed structures.

In the most preferred embodiment the flat surfaces of the rotor (84) and the corresponding interior surface of the housing (88) are planar and smooth. Alternative preferred embodiments can employ the same types of surface geometry modifications as described for the thermal brush (82) and the periphery of the rotor (84).

The most preferred application of the solid thermal conveyer is as an active thermal spreader plate for electronic heat sink applications. Other preferred applications include thermal processing heat exchangers, temperature control of isolated chambers, and thermal equalization of surfaces.

The average rotational velocity of the thermal transfer fluid at a given radius will be halt that of the rotor (84). Since the thermal transfer fluid is moving, it will transport heat from the heat source to the heat sink. In the less preferred embodiment of a relatively thinner rotor surrounded by a relatively thicker thermal transfer fluid layer, heat transfer due to the motion of the thermal fluid will be greater than heat transfer which passes heat through the rotor. In the more preferred embodiment of a relatively thicker rotor surrounded by a relatively thinner thermal transfer fluid layer, heat transfer due to the motion of the thermal fluid will be less than heat transfer which passes heat through the rotor.

Generally the velocity of a solid thermal conveyer increases as its thickness decreases and as its thermal conductivity decreases, so that the heat absorbing capacity of the rotor is constant.

In the most preferred embodiment there is a pocket of atmosphere or inert gas trapped in the internal cavity (90), along with the rotor (84) and the thermal transfer fluid. The presence of gas reduces the amount of thermal transfer fluid used, and it provides a buffer volume to compensate for differences in thermal expansion coefficient between the rotor, the thermal transfer fluid, and the housing (88).

In the most preferred embodiment of the solid thermal conveyer the interior cavity (90) is hermetically sealed, so that air does not leak into or out of the interior cavity (90). This is useful to prevent corrosion, contamination, leakage, and other forms of deterioration. In a less preferred embodiment the interior cavity (90) is allowed to breath through a filter medium or orifice.

The most preferred embodiment uses eddy current drive because there is no strong attractive force between the rotor (84) and the permanent magnet (102) that must be supported by thrust bearings on the rotor (84) and in the motor (106), as is the case with synchronous magnetic coupling. Eddy current drive is also preferable because the rotor (84) typically does not need to rotate at the same high speeds as the fan rotor (108), so that the difference between the rotation rates of the permanent magnet (102) and the rotor (84) which generates the eddy current is desirable. All of the magnetically coupled embodiments can have the advantage of hermetic sealing of the internal cavity without the cost and reliability risks associated with shaft feed throughs and rotating seals. The housing (88) can be any material for which the electromagnetic skin depth is large compared to the thickness of the house (88) through which the moving magnetic fields from the permanent magnet (102) must pass. The moving magnetic field is not attenuated by the housing material if the material is non-magnetic and is not electrically conductive. In the most preferred embodiment the housing is metallic. The skin depth for a good conductor is $c/\sqrt{2\pi\mu\omega\sigma}$, where c is the speed of light, $\mu$ is the magnetic permeability of the conductor, $\omega$ is the angular frequency of the oscillating field, and $\sigma$ is the resistivity of the conductor. For a typical fan spinning at 50 revolutions per second and a permanent magnet with six pole faces around its circumference, $\omega$ is 942 radians per second. The skin depth for pure copper at that frequency is 0.21 inches, and the skin depth for pure aluminum at that frequency is 0.27 inches; for most other metals and alloys the skin depth with be larger. If the housing material itself generates eddy currents, it will consume torque from the fan motor (106).

The assembly shown in FIGS. 8 and 9 can be assembled as a composite substrate. Individual components can be laminated, bonded, or fastened together to form a housing around a rotor and cavity. External surfaces of the composite substrate receive a heat sink means and the heat source.

Figure 10:
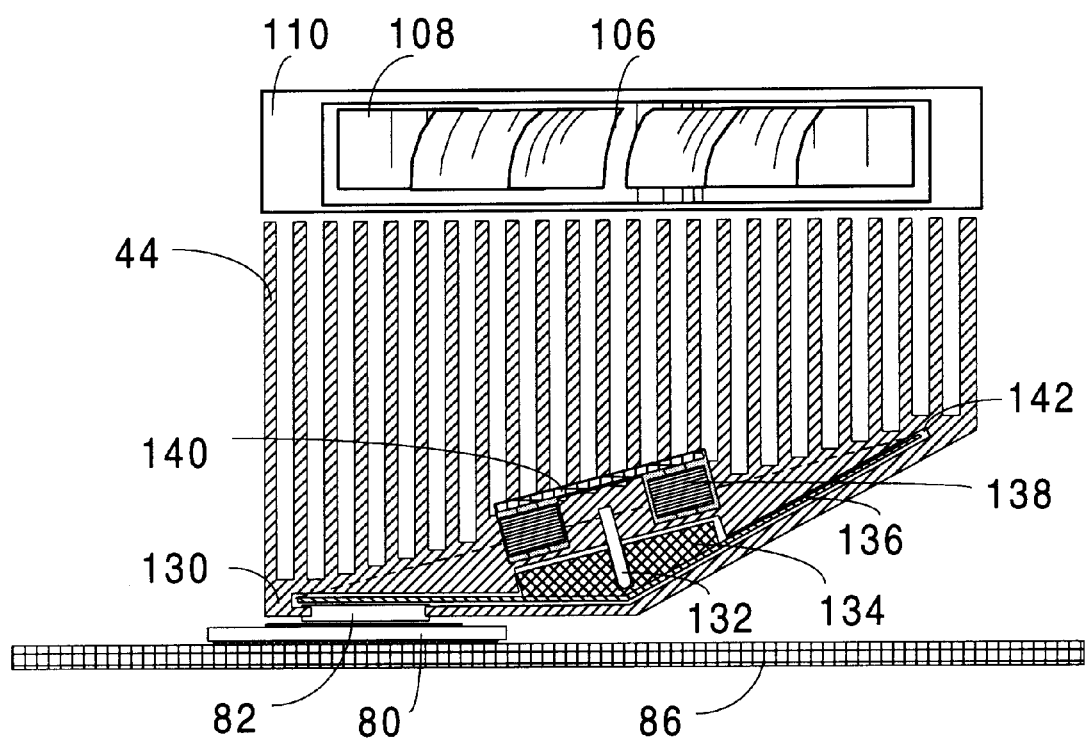
FIG. 10 shows a conformal conical rotary solid thermal conveyer.

FIG. 10 shows an alternative preferred embodiment. A heat source (80) attached to a substrate (86) conducts heat through a compliant layer and through a thermal brush (82) to a compliant solid thermal conveyer in the shape of a cone (136). The cone (136) is formed by stamping, welding, or forging preferably a thermally conductive material such as metals like aluminum, nichrome, or Metglass. Less preferably the cone (136) can be formed of a less thermally conductive material with good flexibility, durability, and stiction properties such as Kapton or Teflon. A conical multiply poled permanent magnet (134) is attached to the center of the cone (136). A bearing pin (132) supports the magnet (134) and locates the cone (136) in a conical cavity (142) in the housing (130). The conical cavity (142) is preferably filled with a liquid metal thermal fluid. Electromagnets (138) attached to a circuit board (140) form a brushless DC motor that rotates the magnet (134) about the bearing pin (132). A fan (110) motivates air to pass through the heat sink (44) in thermal contact with the housing (130).

In FIG. 10 the cone (136) is pressed against the thermal brush (82) by centripetal force; the brush (82) is oriented to slightly distort the surface of the cone (136) towards the cone's axis. In FIGS. 8 and 9 flexure stress in a spring is used to maintain a close tolerance between the rotor and the thermal brush. Other preferred embodiments for maintain proximity between the conveyer and the heat source by both positive and negative pressures generated by a fluid bearing formed between the conveyer and the heat source, such as is formed between the slider and the disk of a magnetic disk assembly. The conveyer can be urged towards the heat source mechanically by a mechanical bearing, a pressure plate, or a roller. The conveyer can be urged towards the heat source using magnetic or electrostatic fields. Capillary forces generated by the thermal transport fluid can also be used to control the gap between the solid thermal conveyer and the heat source.

The thermal resistance between the heat source or thermal brush and the solid thermal conveyer is governed in part by the properties of the thermal transport fluid (if any), the geometry and speed of the solid thermal conveyer, and the thermal properties of the solid thermal conveyer. A substantial limitation for the heat transfer coefficient of the system occurs in the gap between the heat source or thermal brush and the solid thermal conveyer. The upper limit of the gap between the heat source or thermal brush is the thermal conductivity of the material in the gap divided by the required heat transfer coefficient. For liquid metal thermal transport fluids, typical gaps range from 1 mil to 200 mils, with a preferred range being 20 mils or less. For oils and dielectric liquid thermal transport fluids, typical gaps range from 10 microinches to 2 mils, with a preferred range being 200 microinches or less. For gaseous thermal transport fluids, typical gaps range from 2 microinch to 400 microinches, with a preferred range being 40 microinches or less.

A preferred embodiment of the invention uses a liquid metal for the thermal transfer fluid, such as mercury or gallium. In the most preferred embodiment the thermal transport fluid is a metallic alloy with a low melting temperature. Examples of low melt alloys include mixtures of sodium and potassium (liquid at 11° F.), mixtures of gallium, indium, and tin (liquid at 51° F.), and mixtures of bismuth, lead, indium, cadmium, and tin (liquid at 117° F.). Gallium alloys are corrosive to many metals. For example, if a copper rotor is to be used with a gallium alloy thermal transport fluid, the copper should be chrome or titanium plated. Sodium and potassium are advantageous due to their low cost and viscosity, however precautions are required such as minimizing the risk of contacting the metals with water. An alloy which is liquid at the usual operating temperature of the solid thermal conveyer may be initially solid. In a less preferred embodiment electric heaters can be added to the housing (88) to pre-melt or accelerate the melting of the alloy so that the rotor (84) is free to rotate. In the most preferred embodiment the thermal conductivity of the cold rotor is sufficient to initially both cool the heat source and to met the alloy in the internal cavity (90).

A conformal conveyer such as shown in FIG. 10 is desirable so that the heat sink and heat source can be rigidly mounted and small gaps between the solid thermal conveyer and the heat source and heat sink can be maintained dynamically by flexing of the conveyer. The conformal conveyer is less preferred because the heat capacity per unit area of the solid thermal conveyer becomes low enough for thin flexible conveyers that high conveyer velocities are required. A preferred embodiment is to hybrid the thick rigid conveyer with the thin conformal conveyer using a planar conformal thermally conductive layer attached to either the heat source surface or the thermal conveyer surface. One example of such a planar conformal layer is described in U.S. Pat. No. 5,557,501.

The motor (36) in FIG. 3 is shown as a rotary device, such as a DC brushed motor, a brushless DC motor, a step motor, an AC motor, or a switched reluctance motor. Other preferred embodiments utilize hydraulic motors, linear motors, pneumatic motors, and other techniques to generate relative motion.

In FIG. 3 a motor drives the solid thermal conveyer by mechanical engagement. In FIGS. 8 and 9 a motor drives the solid thermal conveyer by moving magnetic fields. In FIG. 10 the solid thermal conveyer is rotated by modulated magnetic fields. Those skilled in the art will be able to apply other motive forces to move the solid thermal conveyer with respect to the heat source, including electrostatic fields, hydraulic coupling, and pneumatic coupling.

In the most preferred embodiment the solid thermal conveyer moves at a constant speed relative to the heat source. In applications where the heat source changes its heat production rate substantially while in operation, a preferred embodiment is to vary the speed of the solid thermal conveyer to be appropriate to the heat production rate; this reduces wear and power consumption by the apparatus. In a less preferred embodiment the speed of the solid thermal conveyer can vary in time independent of the heat production rate of the heat source.

Figure 11:
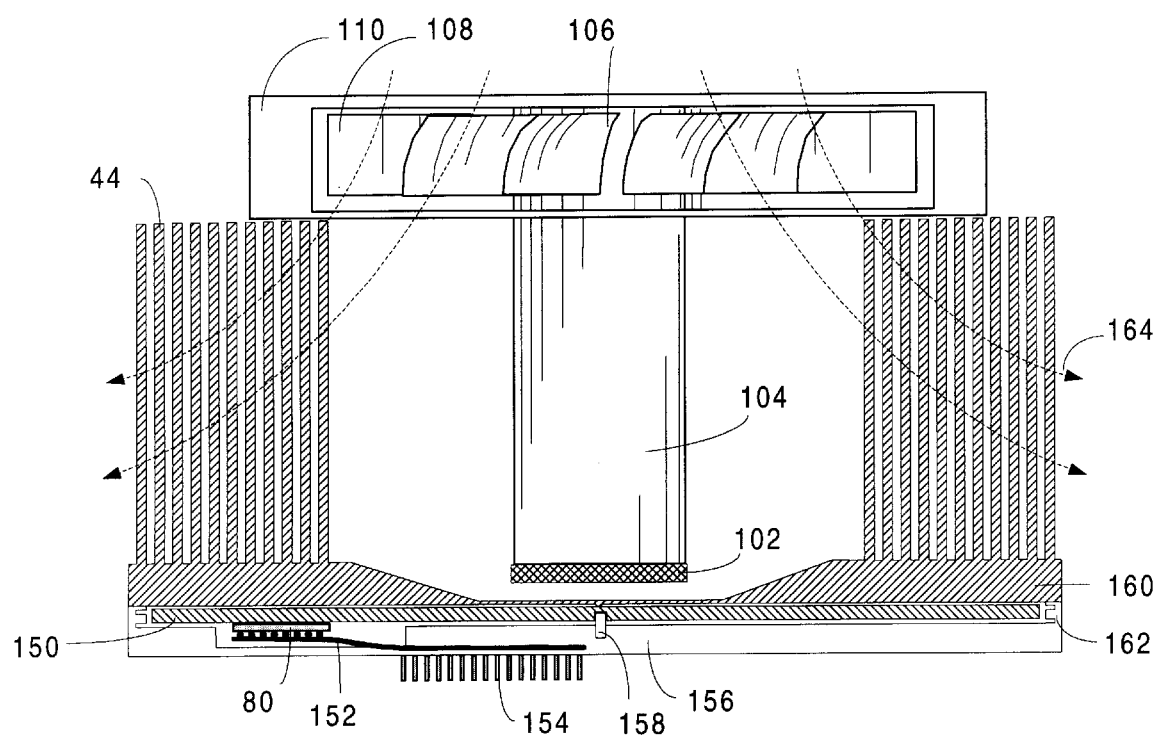
FIG. 11 shows a rotary solid thermal conveyer with a flexibly mounted heat source.

In FIG. 11 the heat source (80) is an electronic chip inside of the composite substrate. A flexure spring and flexible circuit board (152) presses the heat source (80) against a metal rotor (150). The heat source (80) and the rotor (150) are immersed in a thermal transport fluid; fluids like mineral oil or Fluorinert allow the chip to directly contact the fluid, with more standard lubricants the chip (80) should be encased in a module. Electrical contacts (154) connect the electronic chip (80) to the next level of packaging. The bottom (156) of the package carries the contacts (154), the flexure spring and circuit board (152), a bearing pin (158) to hold the rotor (150), and attaches to a passive spreader (160) through a flexure element (162). Heat from the heat source (80) is conducted through the thermal transport fluid to the rotor (150), is conveyed over an annulus, and is conducted through the thermal transport fluid to the passive spread (160), and finally to the fin means (44) and to the air (164) impelled by the fan (110).

Figure 12:
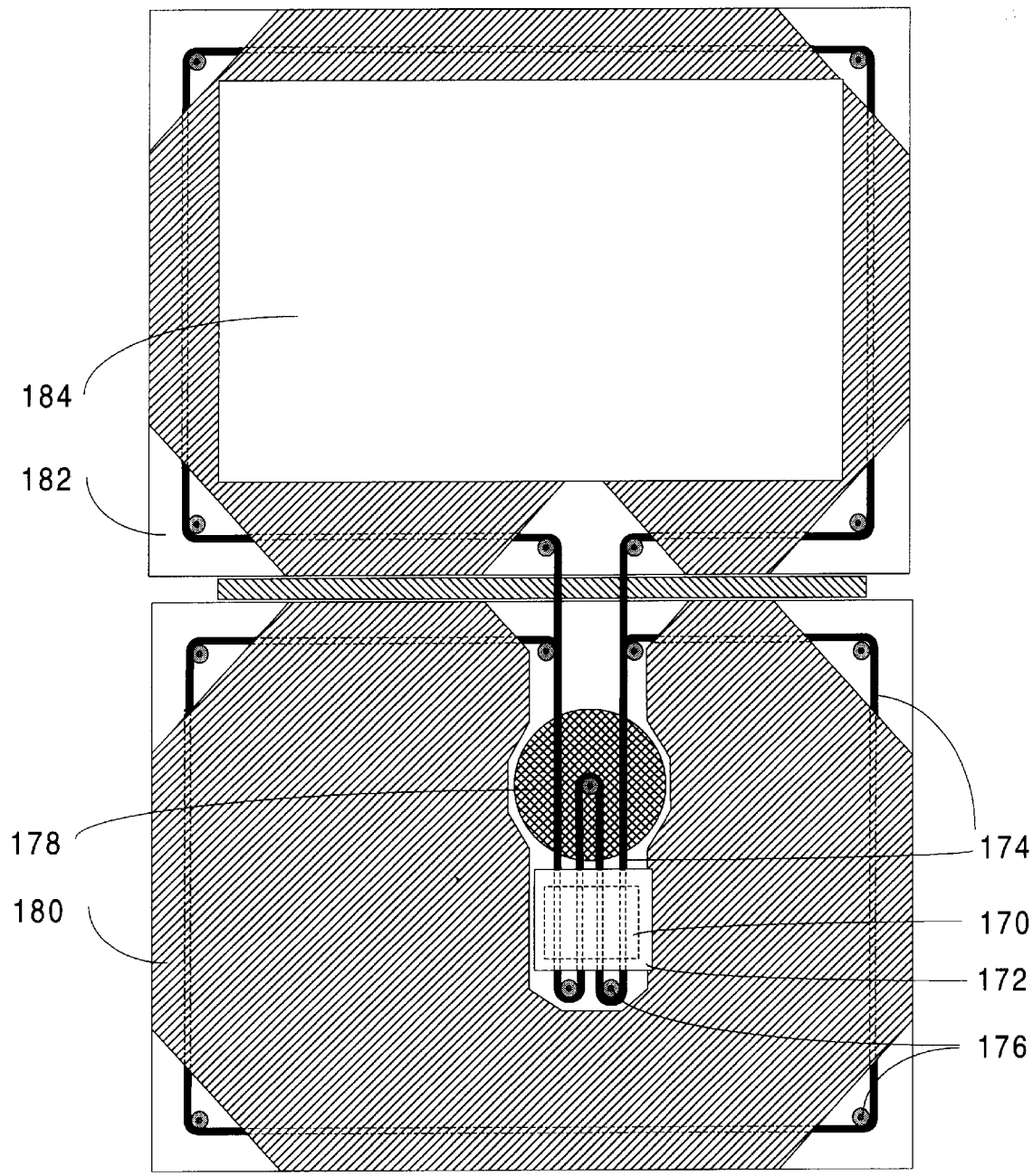
FIG. 12 shows a belt solid thermal conveyer fitted to the case of a laptop computer.

FIG. 12 shows an application of a solid thermal conveyer to a laptop computer, and more generally to a heat sink of arbitrary geometry. A heat source (170) such as a microprocessor is attached to a thermally conducting block (172) containing grooves for a pair of polymeric belts (174). The belts (174) are driven by a motor and capstan (178) to pass over a series of roller (176), causing the belts to traverse near to the perimeters of the base (180) and hinged top (182) of the laptop. The belts transfer heat from the block (172) to the base (180) and top (182), which in turn radiate and convect heat into the ambient.

Figure 13A:
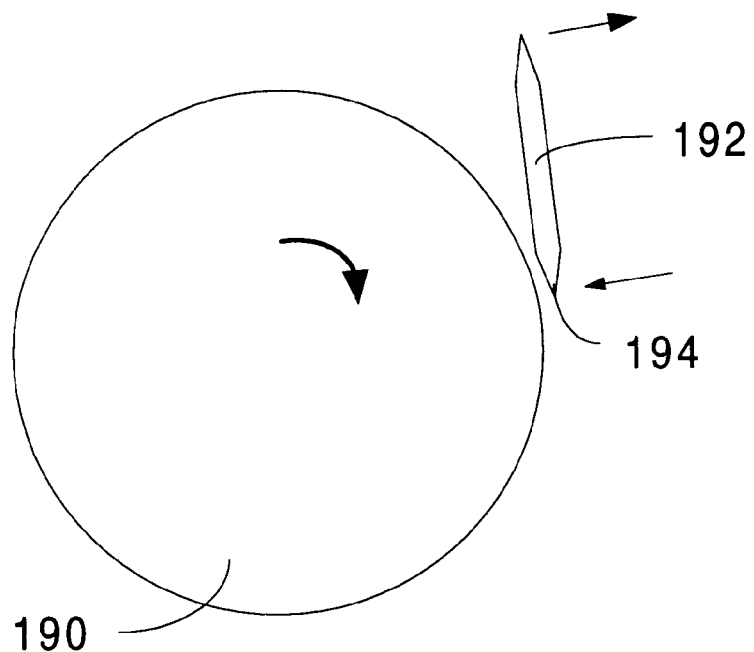
FIG. 13 shows a rotary solid thermal conveyer heat treating an object of manufacture.
Figure 13B:
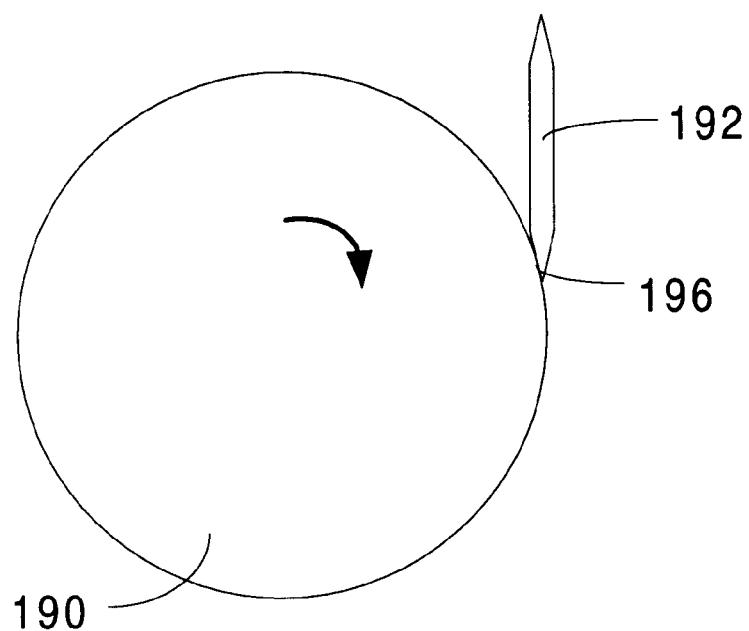

A manufacturing process that might be benefit by the use of a solid thermal conveyer is heat treatment, and more particularly surface tempering of metals. In the tempering process the hot stock material is at least partially immersed in a fluid like oil or water. The resulting rapid cooling of the stock material contains very small crystallites, which typically makes the material harder and more brittle. In FIG. 13a a heated mass such as a razor blade blank (192) is held in proximity to a water cooled rotating copper drum (192). The cylindrical periphery of the drum is wetted with low viscosity oil. The edge to be tempered (194) is quickly displaced to contact the periphery of the drum, as shown in FIG. 13b, creating a tempered edge (196). In some processes i is useful to follow such a tempering step with a rapid heating of the surface, as described in U.S. Pat. No. 5,174, 836. In this case having a second heated wheel against which the edge (196) could be touched would be needed.

A presently preferred embodiment of the present invention and many of its improvements have been described with a degree of particularity. It should be understood that this description has been made by way of preferred example, and that the invention is defined by the scope of the following claims.

The invention claimed is:

1. An apparatus for transferring heat from a heat source, the heat transferring through a first area of the heat source to the apparatus, comprising:
    a fin means having a second area;
    a housing containing a cavity, the housing thermally contacting the first area, the housing thermally contacting the fin means through the second area, the second area being substantially greater than the first area, a third area of the surface of the cavity being proximate to the first area, a fourth area of the surface of the cavity being proximate to the fin means;
    a thermal transfer fluid contained in a first portion of the cavity;
    a solid thermal conveyer rotatably contained in a second portion of the cavity; and
    a means for rotating the solid thermal conveyer in the second portion of the cavity, whereby heat is transferred from the heat source through the first area through the third area of the surface of the cavity and through the thermal transfer fluid to the solid thermal conveyer, and the rotating means rotates the solid thermal conveyer causing the solid thermal conveyer to convey heat, and heat is transferred from the solid thermal conveyer through the thermal transfer liquid through the fourth area of the surface of the cavity through the second area into the fin means.

2. The apparatus as in claim 1, wherein a portion of the housing comprises a high thermal conductivity solid thermal brush, the solid thermal brush receiving the first area of the heat source, and a portion of the surface of the solid thermal brush forming the third area.

3. The apparatus as in claim 2, wherein the solid thermal brush further comprises a compliant thermal connector.

4. The apparatus as in claim 1, wherein the solid thermal conveyer consists of at least one of the following shapes: a cable, a cone, a disk, a drum, an ellipsoid, a filament, a loop, a Mobius strip, a plate, a ribbon, a screen, and a sheet.

5. The apparatus as in claim 1, wherein the heat in the solid thermal conveyer thermally diffuses within the solid thermal conveyer as the solid thermal conveyer is rotating.

6. The apparatus as in claim 1, wherein the solid thermal conveyer has a surface, a portion of the surface consists of at least one of the following topologies: bosses, corrugations, dendrites, fins, flat, grains, grooves, lands, orifices, and pits.

7. The apparatus as in claim 1, further comprising:
a mean for orienting the solid thermal conveyer so that a portion of the surface of the solid thermal conveyer remains closely proximate to the third area, wherein the means for orienting the solid thermal is selected from one of the following mechanisms: capillary forces, centripetal acceleration, eddy current repulsion, electrostatic attraction, electrostatic repulsion, flexure stress in the conformable solid thermal conveyer, flexure stress in a spring, a fluid bearing, magnetic attraction, magnetic repulsion, a mechanical bearing, a pressure plate, and a roller.

8. The apparatus as in claim 7, wherein the means for orienting the solid thermal conveyer maintains a space of less than 0.01 inches between the third area and the portion of the surface of the solid thermal conveyer.

9. The apparatus as in claim 1, wherein the means for rotating the solid thermal conveyer uses a coupling mechanism consisting of one of the following coupling mechanisms: electrostatic fields, modulated magnetic fields, moving magnetic fields, hydraulic coupling, mechanical engagement, and pneumatic coupling.

10. The apparatus as in claim 1, wherein the solid thermal conveyer rotates at varying speeds.

11. The apparatus as in claim 1, wherein the thermal transfer fluid consisting of at least one of the following materials: air, ammonia, argon, bismuth, fluorinated hydrocarbons, gallium, grease, helium, lubricating oil, mercury, mineral oil, nitrogen, potassium, silicon oil, sodium, tin, water, water soluble grease, and xenon.

12. The apparatus as in claim 1, further comprising:
a filtration means that filters the thermal transfer fluid.

13. The apparatus as in claim 12, further comprising:
a pumping means that pumps the thermal transfer fluid through the filtration means,
wherein the pumping means is selected from at least one of the following mechanisms: centripetal pump, displacement pump, and viscosity pump.

14. The apparatus as in claim 1, further comprising a means for repelling a portion of the surface of the solid thermal conveyer from the third area, wherein the repelling means is selected from one of the following mechanisms: the Bernoulli effect, the Von Karman pump, impingement flow, a step bearing, a viscosity pump, and a wedge fluid bearing.

15. The apparatus as in claim 14, wherein the means for repelling the portion of the surface of the solid thermal conveyer from the third area maintains an average minimum spacing of at least 10 microinches between the surface solid thermal conveyer and the third area.

16. A method for transferring heat from a heat source, the heat source having a first area, comprising:
transferring heat from the heat source through the first area into a housing, the housing containing a cavity, a first portion of the cavity rotatably containing a solid thermal conveyer, a second portion of the cavity containing a thermal transfer fluid, the housing being in thermal communication with a fin means through a second area, the second area being substantially greater than the first area;
rotating the solid thermal conveyer in the cavity; transferring heat from the housing through a third area of the surface of the cavity and through the thermal transfer fluid into the solid thermal conveyer, the third area of the surface of the cavity being proximate to the first area;
conveying heat in the rotating solid thermal conveyer;
transferring heat from the solid thermal conveyer through the thermal transfer fluid and through a fourth area of the surface of the cavity into the housing, the fourth area of the surface of the cavity being proximate to the second area; and
transferring heat from the housing through the second area into the fin means.

17. An apparatus for transferring heat from a heat source to a heat sink, the heat transferring through a first area of the heat source to the apparatus, the heat transferring from the apparatus through a second area to the heat sink, comprising:
a housing containing a cavity, the housing thermally contacting the first area and the second area, the second area being substantially greater than the first area, a third area of the surface of the cavity being proximate to the first area, a fourth area of the surface of the cavity being proximate to the second area;
a thermal transfer fluid contained in a first portion of the cavity;
a solid thermal conveyer rotatably contained in a second portion of the cavity; and
a means for rotating the solid thermal conveyer in the second portion of the cavity, whereby heat is transferred from the heat source through first area through the third area of the cavity through the thermal transfer fluid to the solid thermal conveyer, the rotating means rotates the solid thermal conveyer causing the solid thermal conveyer to convey heat, and heat is transferred from the solid thermal conveyer through the thermal transfer liquid through the fourth area of the surface of the cavity through the second area into the heat sink.

* * * * *